United States Patent
Lu et al.

(10) Patent No.: US 11,621,649 B2
(45) Date of Patent: Apr. 4, 2023

(54) PHASE SEQUENCE ADJUSTMENT SYSTEM AND PHASE SEQUENCE ADJUSTMENT METHOD

(71) Applicant: DELTA ELECTRONICS, INC., Taoyuan (TW)

(72) Inventors: Lin-Yu Lu, Taoyuan (TW); Ming-Tsung Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 59 days.

(21) Appl. No.: 17/362,934

(22) Filed: Jun. 29, 2021

(65) Prior Publication Data

US 2022/0190743 A1 Jun. 16, 2022

(30) Foreign Application Priority Data

Dec. 14, 2020 (CN) .......................... 202011471470.8

(51) Int. Cl.
*H02M 7/219* (2006.01)
*G01R 29/18* (2006.01)
*H02M 7/217* (2006.01)

(52) U.S. Cl.
CPC ............ *H02M 7/219* (2013.01); *G01R 29/18* (2013.01); *H02M 7/2173* (2013.01)

(58) Field of Classification Search
CPC .. H02M 7/219; H02M 7/2195; H02M 7/2173; H02M 1/4216; H02J 3/44
See application file for complete search history.

(56) References Cited

U.S. PATENT DOCUMENTS

| | | | |
|---|---|---|---|
| 4,172,234 A | 10/1979 | Gyugyi et al. | |
| 5,210,685 A | 5/1993 | Rosa | |
| 9,557,359 B2 | 1/2017 | Ishihara et al. | |
| 9,559,625 B2 | 1/2017 | Yang et al. | |
| 2005/0207192 A1* | 9/2005 | Fu .......................... | H02M 7/219 363/89 |

(Continued)

FOREIGN PATENT DOCUMENTS

| | | |
|---|---|---|
| CN | 203261126 U | 10/2013 |
| CN | 104410096 B | 8/2016 |

(Continued)

*Primary Examiner* — Alex Torres-Rivera
(74) *Attorney, Agent, or Firm* — CKC & Partners Co., LLC (57) ABSTRACT

A phase sequence adjustment system includes a power conversion circuit and a control circuit. The power conversion circuit is connected to a main power supply with a phase sequence. The control circuit respectively provides a first and a second excitation signals to the power conversion circuit, so as to short the power conversion circuit with the main power supply twice. The control circuit includes a current detection circuit and a control unit. The current detection circuit obtains two current signals respectively during two short-circuit operations. The control unit calculates two current phase angles respectively according to these two current signals and determines whether the phase sequence is positive or negative accordingly. The control unit selects one from the two current phase angles, calculates a voltage phase angle of the main power and a phase angle difference there-between to adjust a feedback phase sequence accordingly.

15 Claims, 9 Drawing Sheets

(56) References Cited

U.S. PATENT DOCUMENTS

2011/0134669 A1\* 6/2011 Yuzurihara ........... H02M 7/219
363/89
2017/0229857 A1 8/2017 Kral et al.
2019/0288607 A1\* 9/2019 Zong ................. H02M 3/33584

FOREIGN PATENT DOCUMENTS

| CN | 107968403 A | 4/2018 |
| --- | --- | --- |
| CN | 108270365 A | 7/2018 |
| CN | 108900121 A | 11/2018 |
| TW | I220593 B | 8/2004 |
| WO | 80/01443 A1 | 7/1980 |

\* cited by examiner

PHASE SEQUENCE ADJUSTMENT SYSTEM AND PHASE SEQUENCE ADJUSTMENT METHOD

CROSS-REFERENCE TO RELATED APPLICATION

This application claims priority to China Application Serial Number 202011471470.8, filed Dec. 14, 2020, which is herein incorporated by reference in its entirety.

BACKGROUND

Field of Invention

The disclosure relates to an adjustment method and an adjustment system for a power conversion circuit connected in parallel to a main power supply grid, particularly to a phase sequence adjustment method and a phase sequence adjustment system able to perform automatic detection and modification.

Description of Related Art

When a power conversion device is connected in parallel to a main power supply, for the stable operation of the system, wire connection sequence between the power conversion device and the main power supply grid must be confirmed, so as to ensure that a phase sequence received by the power conversion device is consistent with a phase sequence outputted by the main power supply, which is to ensure that the phase sequences are consistent, and to provide an accurate voltage, current feedback information to the controller of the power conversion device to perform the following operations.

If there is an error in wire connection sequence between the power conversion device and the main power supply grid, causing an error in phase sequence also, the information of the voltage, current cannot be accurately feedback, and the system may fail to startup or be in an abnormal condition. Therefore, how to simply and effectively detect and modify the phase sequence without reconnecting wires is one of the important issues in this technique field.

SUMMARY

To solve the aforesaid problems, one aspect of the present disclosure is to provide a phase sequence adjustment system. The phase sequence adjustment system includes a power conversion circuit and a control circuit. The power conversion circuit is connected to a main power supply with a phase sequence. The control circuit is configured to provide a first excitation signal and a second excitation signal to a plurality of switches of the power conversion circuit at different time points, respectively, to perform two short-circuit operations between the power conversion circuit and the main power supply. The control circuit includes a current detection circuit and a control unit. The current detection circuit is configured to detect a first current signal corresponding to the first excitation signal and a second current signal corresponding to the second excitation signal, during the two short-circuit operations between the power conversion circuit and the main power supply. The control unit is configured to calculate a first current phase angle and a second current phase angle, respectively, according to the first current signal and the second current signal, and the control unit is configured to select a current phase angle from the first current phase angle and the second current phase angle and correspondingly calculate a voltage phase angle of the main power supply. The control unit determines whether the phase sequence is positive or negative according to the first current phase angle and the second current phase angle, and the control unit calculates a phase angle difference between the selected current phase angle and the voltage phase angle, to adjust a feedback phase sequence of the power conversion circuit, according to the phase angle difference, to the current detection circuit.

Another aspect of the present disclosure is to provide a phase sequence adjustment method. The phase sequence adjustment method includes the following steps. Applying a first excitation signal to a power conversion circuit to short the power conversion circuit with a main power supply, and obtaining a first current signal corresponding to the first excitation signal, wherein the power conversion circuit is electrically coupled to the main power supply with a phase sequence. Applying a second excitation signal to the power conversion circuit to short the power conversion circuit with the main power supply again after a time interval, and obtaining a second current signal corresponding to the second excitation signal. Calculating a first current phase angle and a second current phase angle according to the first current signal and the second current signal, respectively. Determining whether the phase sequence is positive or negative according to the first current phase angle and the second current phase angle. Calculating a voltage phase angle of the main power supply corresponding to one of the first current phase angle and the second current phase angle obtained during short-circuit operations according to the phase sequence is positive or negative. Calculating a phase angle difference between the voltage phase angle and the corresponding one of the first current phase angle and the second current phase angle. And, adjusting a feedback phase sequence of the power conversion circuit according to the phase angle difference.

In summary, the present disclosure is able to perform the first short-circuit operation at any time by applying the first excitation signal to the power conversion circuit, and perform the second short-circuit operation after an appropriate time interval by applying the first excitation signal to the power conversion circuit. According to two sets of the voltage detection signals and two sets of the current signals corresponding to the two short-circuit operations, two current phase angles received by the power conversion circuit and the voltage phase angles of the main power supply during two short-circuit operations are able to be calculated. According to the phase angle difference obtained from one of two current phase angles and the voltage phase angle corresponding to the short-circuit operation, the phase sequence at this moment is able to be determined, so as to adjust the phase sequence of power conversion circuit which has possibly incorrect connection sequence of three phase wires to be consistent with the phase sequence of the main power supply by transmitting the command of feedback phase sequence to the power conversion circuit, so as to provide correct voltage and current feedback information.

It is to be understood that both the foregoing general description and the following detailed description are by examples and are intended to provide further explanation of the invention as claimed.

BRIEF DESCRIPTION OF THE DRAWINGS

The invention can be more fully understood by reading the following detailed description of the embodiment with reference to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure, and descriptions of structure operation do not intend to limit the order of execution, any structure that reassembles the components to produce a device with equal efficacy is within the scope of the present invention.

Figure 1:
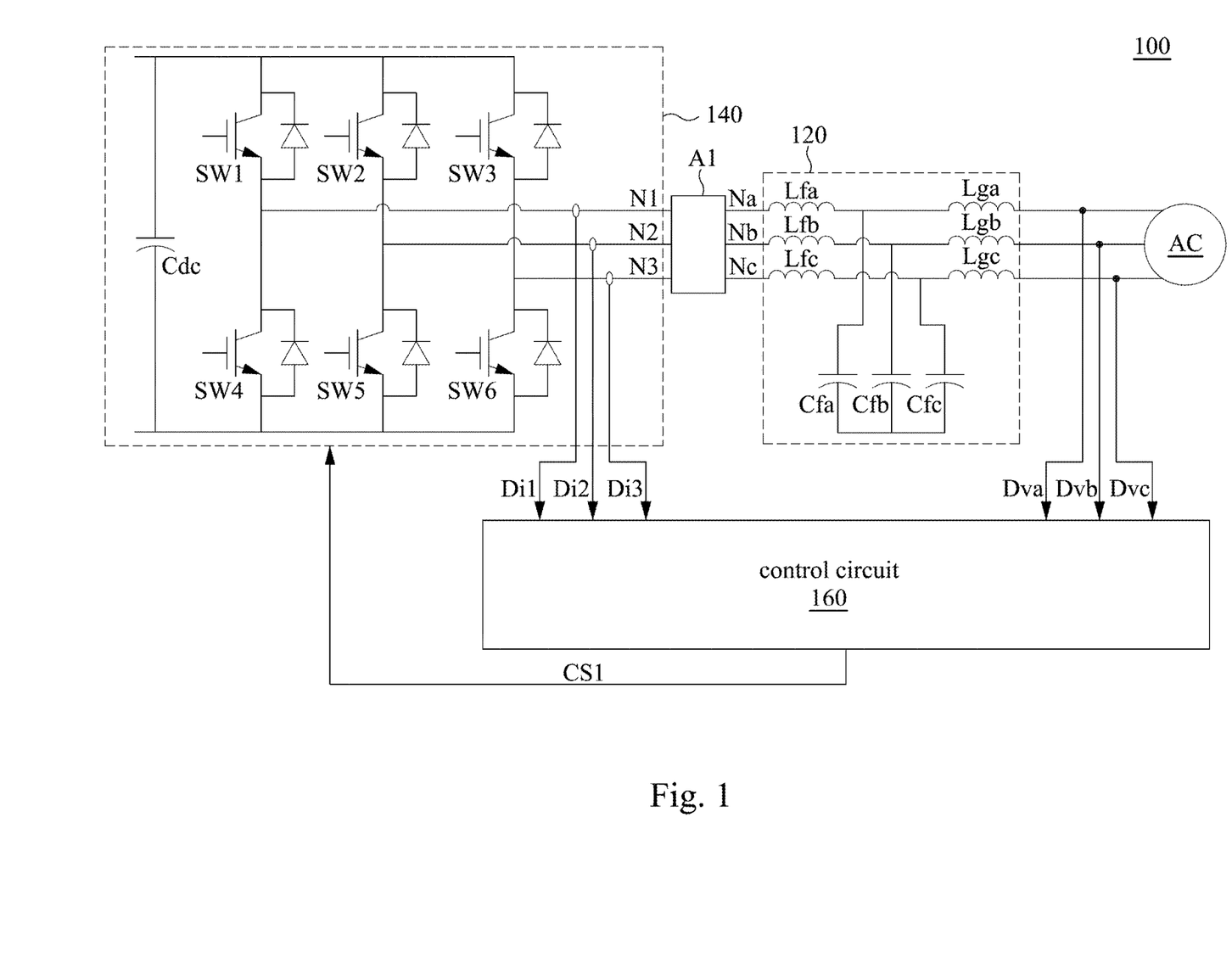
FIG. 1 and FIG. 2 are schematic diagrams of a phase sequence adjustment system in accordance with some embodiments of the present disclosure.

Please refer to FIG. 1. As shown in FIG. 1, the phase sequence adjustment system 100 includes an output filter circuit 120, a power conversion circuit 140 and a control circuit 160. The output filter circuit 120 is electrically connected between a main power supply AC and the power conversion circuit 140. Specifically, an input terminal of the output filter circuit 120 is electrically connected to the main power supply in parallel, and the power conversion circuit 140 is electrically connected to the main power supply AC with a phase sequence. The control circuit 160 is connected to the power conversion circuit 140.

In some embodiments of the disclosure, the output filter circuit 120 can includes multiple of filter inductors Lfa~Lfc, Lga~Lgc and multiple of filter capacitors Cfa~Cfc. The power conversion circuit 140 can be implemented by the three-phase conversion circuit with six-arms, which includes multiple of switches SW1~SW6 and a capacitor Cdc. In structure, the filter inductors Lfa and Lga are electrically connected in serial between the main power supply AC and a node Na. A terminal of the filter capacitor Cfa is connected between to the filter inductors Lfa and Lga, and another terminal of the filter capacitor Cfa is grounded. The switches SW1 and SW4 are connected to the node N1.

Similarly, the filter inductors Lfb and Lgb are electrically connected in serial between the main power supply AC and the node Nb. A terminal of the filter capacitor Cfb is connected between the filter inductors Lfb and Lgb, and another terminal of the filter capacitor Cfb is grounded. The switches SW2 and SW5 are connected to the node N2. And, the filter inductors Lfc and Lgc are electrically connected in serial between the main power supply AC and the node Nc. A terminal of the filter capacitor Cfc is connected between the filter inductors Lfc and Lgc, and another terminal of the filter capacitor Cfc is grounded. The switches SW3 and SW6 are connected to the node N3. As shown in FIG. 1, the phase sequence of the electrical connection between the output filter circuit 120 and the main power supply AC is consistent with the phase sequence of the output of the main power supply AC.

In operation, the power conversion circuit 140 receives the mina power supply AC through the output filter circuit 120 and accordingly outputs an alternating current power, so as to perform AC-DC conversion. The control circuit 160 is configured to receive three-phase voltage detection signals Dva~Dvc between the main power supply AC and the input terminal of the output filter circuit 120, and to receive three-phase current detection signals Di1~Di3 between the output terminal of the output filter circuit 120 and the power conversion circuit 140, and the control circuit 160 is configured to output a driving control signal CS1 to at least one of the multiple switches SW1~SW6 of the power conversion circuit 140 according to the voltage detection signals Dva~Dvc and current detection signals Di1~Di3, so as to perform driving control.

Figure 2:
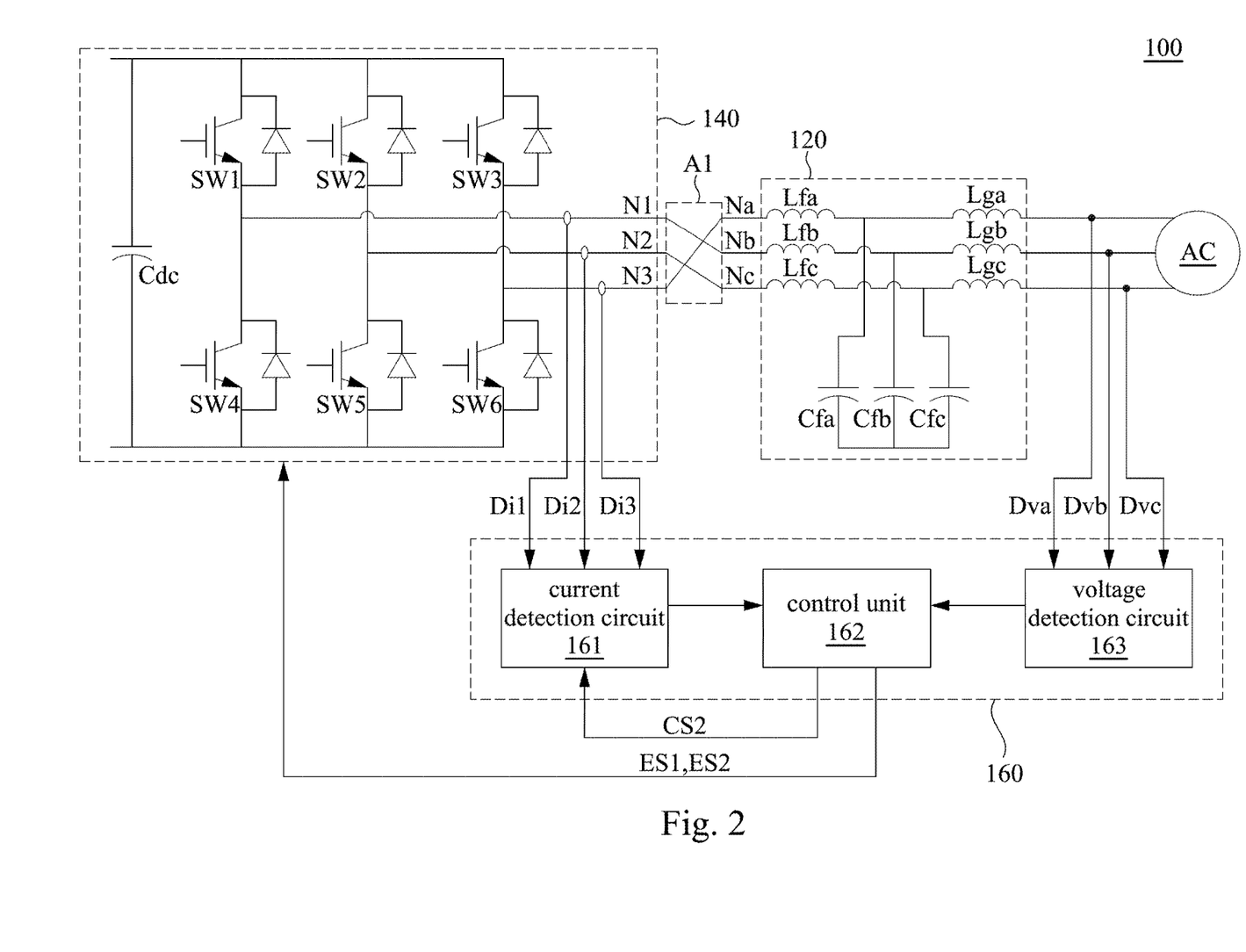

To ensure that the driving control signal CS1 generated by voltage and current detection signals are fed back to the corresponding switches, the phase sequence of the three phase wire connections formed by electrically connecting the power conversion circuit 140 to the output filter circuit 120 through the conducting wires can be consistent with the phase sequence of the three phase wires formed by electrically connecting the output filter circuit 120 to the main power supply AC through the conducting wires. However, there usually requires human to set up the electrically connection between the power conversion circuit 140 and the output filter circuit 120 through the conducting wires, which causes that the connection sequence of the three phase wires is not reliable during human installation and human check. For example, as shown in FIG. 2, the dash line area A1 is the place to connect the conducting wires by human installation. If the nodes N1, N2 and N3 in the area A1 are not correspondingly connect to the nodes Na, Nb and Nc, as the embodiment shown in FIG. 2, the power conversion circuit 140 is electrically connected to the output filter circuit 120 with an incorrect phase sequence that is phase b, phase c, phase a in order, and the phase sequence of the output filter circuit 120 is consistent with the main power supply AC, that is, the power conversion circuit 140 is substantially electrically connected to the main power supply AC with phase sequence of phase b, phase c, phase a. If the system is operating without being aware of the error in connection sequence of conducting wires for electrically connecting the power conversion circuit 140 through the output filter circuit 120 to the main power supply AC, causing the power conversion circuit 140 electrically connected to the main power supply AC with wrong phase sequence during the operation of the system, and the error in phase sequence causes the wrong feedback control of the voltage and the current.

To solve the aforesaid issue, the present disclosure provides a phase sequence adjustment method. No matter what the connection sequence at the area A1 is, the phase sequence adjustment system 100 can determine the phase sequence at this moment according to the voltage detection signals Dva~Dvc and the current detection signals Di1~Di3, and redefine the control signal of the feedback phase sequence of the three phase wires according the phase sequence at this moment, so as to ensure that the control signal of the feedback phase sequence accurately match corresponding switch and phase sequence.

Specifically, as shown in FIG. 2, the control circuit 160 includes a voltage detection circuit 163, a control unit 162 and a current detection circuit 161. The voltage detection circuit 163 is electrically connected to the main power supply AC and input terminal of the output filter circuit 120. The current detection circuit 161 is electrically connected to output terminal of the output filter circuit 120 and the power conversion circuit 140. The control unit 162 is electrically connected to the voltage detection circuit 163, the current detection circuit 161 and the power conversion circuit 140.

In operation, the control unit 162 is configured to consecutively output a first excitation signal ES1 and a second excitation signal ES2 to the switches SW1~SW6 of the power conversion circuit 140 in a time interval, so as to perform two short-circuit operations and obtain the two sets of the current detection signals Di1~Di3. The voltage detection circuit 163 is configured to receive two sets of the voltage detection signals Dva~Dvc obtained at time points corresponding to the two short-circuit operations of the three phase wires between the main power supply AC and the output filter circuit 120. The control unit 162 is configured to determine the phase sequence between the power conversion circuit 140 and the main power supply AC at this moment according to the two sets of voltage detection signals Dva~Dvc and the two sets of current detection signals Di1~Di3, and the control unit 162 transmits the corrected feedback control signal CS2 to the current detection circuit 161 according to the definition of the three phase wires at this moment, the feedback control signal CS2 includes definition of the three phase wires verified by the phase sequence at this moment. In one embodiment, the control unit 162 can be implemented by a signal generator, a processor circuit with specific digital logic (such as, with functions to execute the application program) or a control circuit with field programmable gate array, the control unit 162 generates feedback control signal CS2, according to the phase sequence determined at this moment, to the current detection circuit 161. As a result, the current detection circuit 161 is able to determine the current phase of each path of the three phase wires according to the feedback control signal CS2, and the current phase determined by the current detection circuit 161 after receiving the feedback control signal CS2 is able to correspond to the correct three phase definition of the main power supply AC. That is, the three phase definition of physical wires connection between the power conversion circuit 140 and the main power supply AC can avoid failing to match the subsequent feedback control signal CS2 caused by different definitions of phase sequences.

Figure 3:
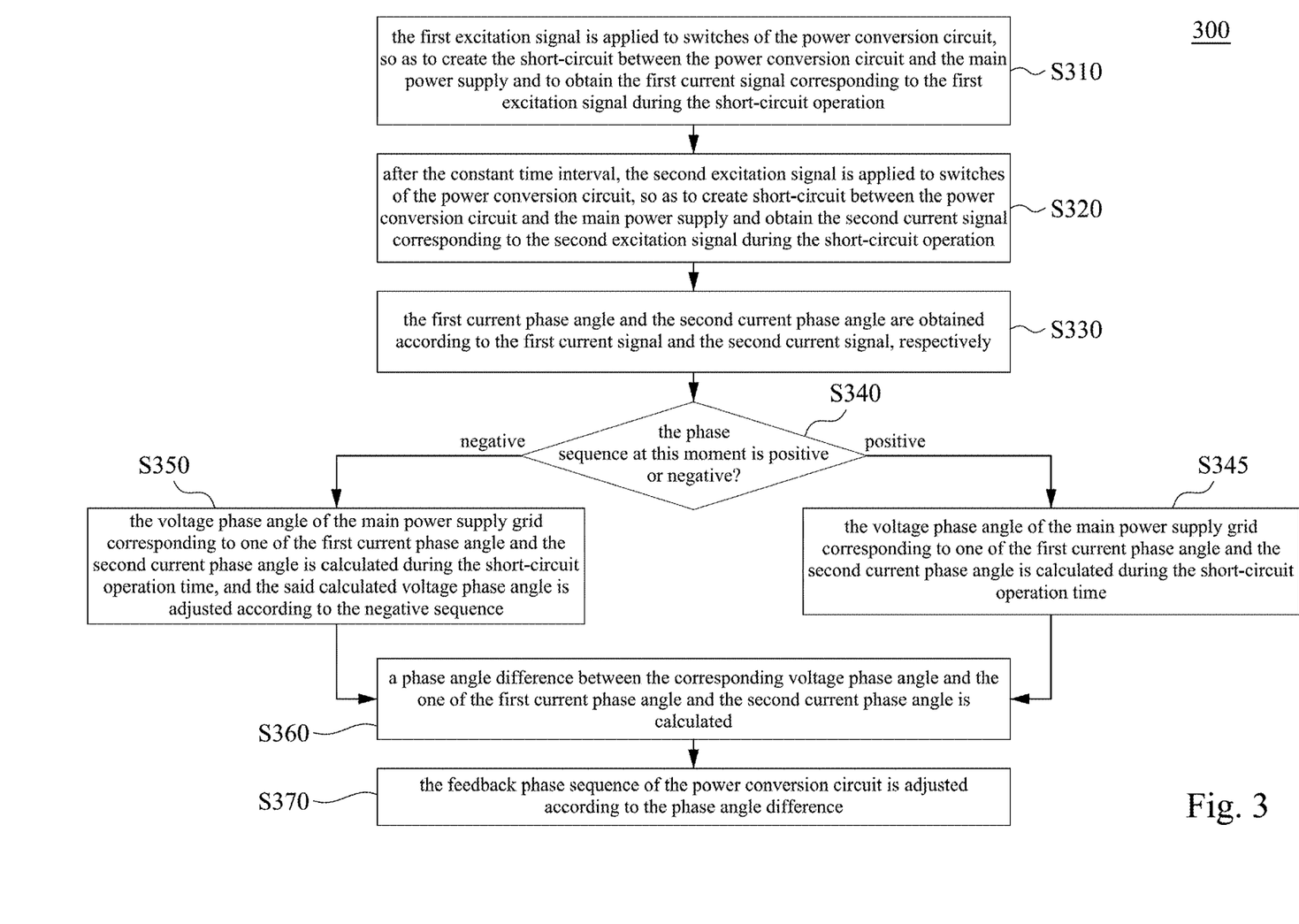
FIG. 3 is a flow chart of a phase sequence adjustment method in accordance with some embodiments of the present disclosure.

Please refer to FIG. 3. For convenience and clarity, the following description for phase sequence adjustment method 300 is cooperated with embodiments shown in FIG. 2, FIG. 4 and FIG. 5. Although the disclosure has been disclosed as above in the implementation mode, it is not limited to this disclosure. Anyone who is familiar with this skill can make various modifications and retouches without departing from the spirit and scope of this case. As shown in FIG. 3, the phase sequence adjustment method 300 includes steps S310, S320, S330, S340, S345, S350, S360 and S370.

First, in step S310, at any time, a first excitation signal ES1 is applied to multiple switches, such as SW4, SW5 and SW6, by the control unit 162, and a first current signal corresponding to the first excitation signal ES1 during this operation is obtained by the control unit 162. Specifically, the lower arm switches SW4, SW5 and SW6 are conducted simultaneously according to the first excitation signal ES1. In other words, the first excitation signal ES1 is applied to the power conversion circuit 140 by the control unit 162 of the control circuit 160, such that a short-circuit is built between the three-phase bridge arms of the power conversion circuit 140 and the main power supply AC, and the current detection signals Di1~Di3 is obtained as the first current signal in response to the first excitation signal ES1 during a time interval of the short-circuit operation. To be noted that, the aforesaid short-circuit operation can also be achieved by applying the first excitation signal ES1 to the upper arm switches SW1, SW2 and SW3 of the power conversion circuit 140, so as to conduct the upper arm switches SW1, SW2 and SW3, simultaneously.

Figure 4:
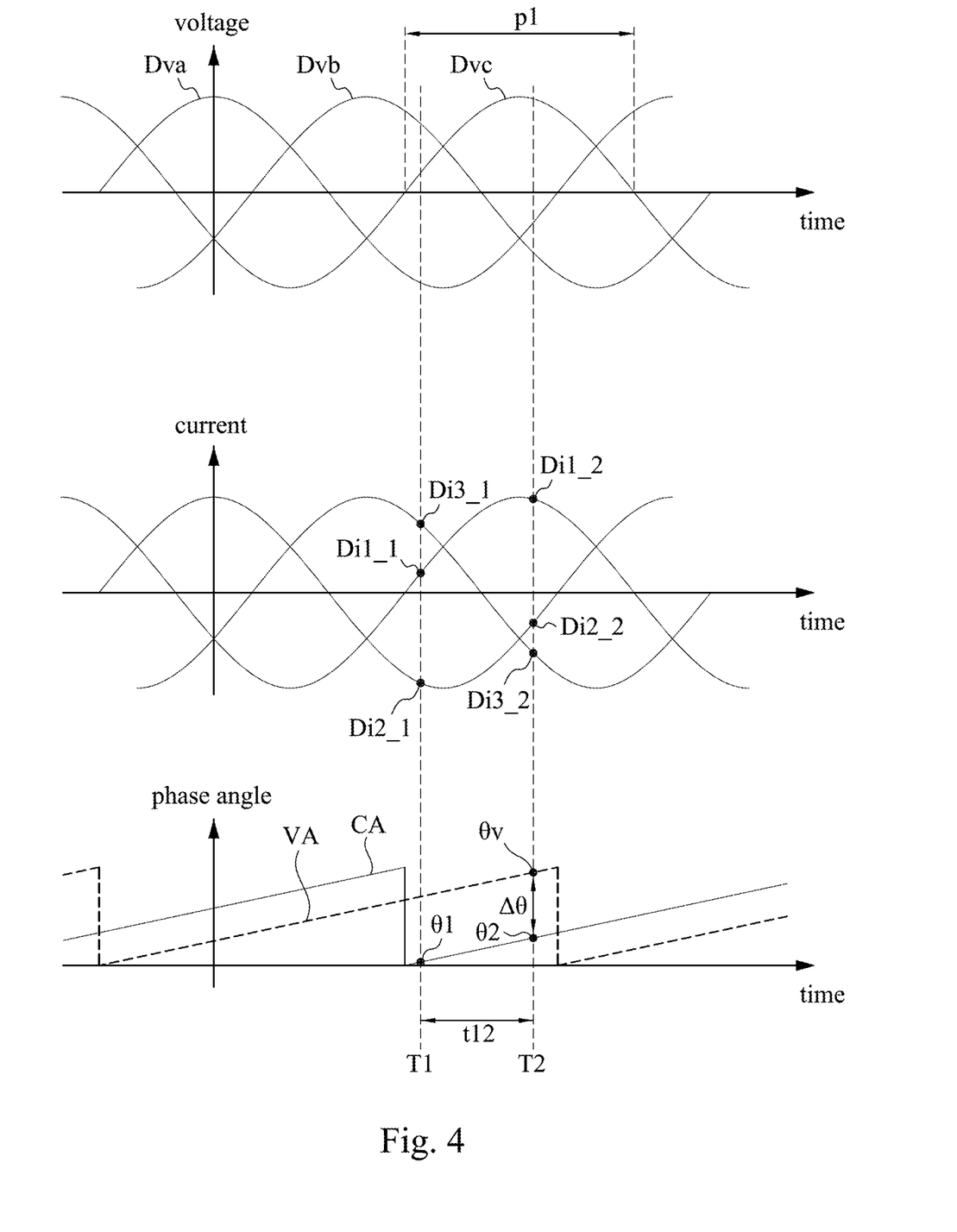
FIG. 4 is a waveform schematic diagram of voltages and currents according to embodiments shown in FIG. 2.

For example, the reference is made to FIG. 4, at time point T1, the first excitation signal ES1 is transmitted to the power conversion circuit 140 by the control unit 162 to perform the first short-circuit operation, and the first current signals Di1_1~Di3_1 is obtained accordingly by the current detection circuit 161. In embodiments of the disclosure, the time point T1 can be implemented by any time point, that is, no matter what phase angle of the main power supply AC is, the control unit 162 can apply the first excitation signal ES1 to the power conversion circuit 140, to perform the first short-circuit, at any time. As a result, even if the voltage band of the main power supply AC has specific non-ideal interference or harmonic wave, the detection result can be avoided from wrong determination.

Continue, in step S320, after a constant or specific time interval, the second excitation signal ES2 is applied to the multiple switches SW4, SW5 and SW6 of the power conversion circuit 140 by the control unit 162 to conduct the switches of power conversion circuit 140 again, such that a short-circuit between all of the three phase arms of the power conversion circuit 140 and the main power supply AC are formed. And the other set of current detection signals Di1~Di3 are obtained by the current detection circuit 161 as the second current signal in response to the second excitation signal ES2 during the short-circuit operation. Specifically, step S320 is similar to step S310, and the formation and effects of the second excitation signal ES2 are also similar to the first excitation signal ES1, thus the explanation is omitted.

For example, as shown in FIG. 4, at a time point T2, the second excitation signal ES2 is transmitted to the power conversion circuit 140 by the control unit 162 to perform the second short-circuit, and the second current signals Di1_2~Di3_2 is obtained by the current detection circuit 161, accordingly. The time interval t12 between the time points T1 and T2 is shorter than a half period p1 of the output signal of the main power supply AC. In other words, during the half period p1 of the output signal of the main power supply AC, the control unit 162 of the control circuit 160 respectively applies two excitation signals ES1 and ES2 to power conversion circuit 140 to perform two short-circuit operations, and two sets of the current signals Di1_1~Di3_1 and Di1_2~Di3_2 corresponding to the two short-circuit operations are obtained by the current detection circuit 161.

Continue, in step S330, the first current phase angle θ1 corresponding to the first short-circuit operation at time point T1 is calculated according to the first current signals Di1_1~Di3_1 at the time point T1. In additional, the second current phase angle θ2 corresponding to the second short-circuit operation at time point T2 is calculated according to the second current signals Di1_2~Di3_2 at the time point T2. Specifically, the calculation of the current phase angle at any time point can be reference to the following derivations.

$$\begin{bmatrix} Vd \\ Vq \end{bmatrix} = \begin{bmatrix} Rf + pLf & -\omega Lf \\ \omega Lf & Rf + pLf \end{bmatrix} \begin{bmatrix} id \\ iq \end{bmatrix} + Vg \begin{bmatrix} 0 \\ 1 \end{bmatrix} \quad \text{formula (1)}$$

The formula (1) is a voltage function of d-axis and q-axis at a stationary reference frame. In the formula (1), p is a differential operator, Lf and Rf respectively are capacitance and inductance of the output filter circuit 120, w is alternating current signal frequency of the main power supply grid, Vg is voltage value of the main power supply grid.

When the power conversion circuit 140 is received the excitation signals ES1, ES2 so as to perform the short-circuit operations, since the voltage values Vg and Vq of d-axis and q-axis are both equal to 0 during the short-circuit operations, that is, $$\begin{bmatrix} Vd \\ Vq \end{bmatrix} = \begin{bmatrix} 0 \\ 0 \end{bmatrix}$$

is substituted to aforementioned formula (1) to derivate the formula (2), in which the Tsh is hold-up time of the short-circuit operation.

$$\begin{bmatrix} 0 \\ 0 \end{bmatrix} = \begin{bmatrix} pLf & -\omega Lf \\ \omega Lf & pLf \end{bmatrix}\begin{bmatrix} id \\ iq \end{bmatrix} + Vg\begin{bmatrix} 0 \\ 1 \end{bmatrix} \rightarrow \begin{bmatrix} id(Tsh) \\ iq(Tsh) \end{bmatrix} = \begin{bmatrix} -\frac{Vg}{Lf}(1 - \cos\omega Tsh) \\ -\frac{Vg}{Lf}\sin\omega Tsh \end{bmatrix} \quad \text{formula (2)}$$

From the above formula (2), the current functions id(Tsh) and iq(Tsh) of d-axis and q-axis during the short-circuit operation can be found out, such that the current phase angle at this moment can be obtained, accordingly, as shown in formula (3).

$$\theta e(t) \cong \tan^{-1}\left(\frac{iq(t)}{id(t)}\right) - \tan^{-1}\left(\frac{iq(Tsh)}{id(Tsh)}\right) \quad \text{formula (3)}$$

Accordingly, the former term $$\tan^{-1}\left(\frac{iq(t)}{id(t)}\right)$$

in formula (3) of the current phase angle θe(t) can be obtained by converting the current at this moment to the stationary reference frame, the latter term $$\tan^{-1}\left(\frac{iq(Tsh)}{id(Tsh)}\right)$$

in formula (3) of the current phase angle θe(t) can be obtained by substituting main power supply frequency and related parameter to formula (2). The parameter at the time point T1 is substituted to the formula (3) to calculate the first current phase angle θ1 corresponding to the first short-circuit operation at the time point T1. In additional, the parameter at time point T2 is substituted to the formula (3) to calculate the second current phase angle θ2 corresponding to the second short-circuit operation at the time point T2.

Besides, the alternating current signal frequency ω of the main power supply grid shown in formula (2) not only can be determined by the predetermined value of the main power supply grid, it can also be obtained by calculating the following formula (4) according to two sets of current phase angles.

$$\omega = \frac{1}{\tau 12}\left(\tan^{-1}\left(\frac{iq(T2)}{id(T2)}\right) - \tan^{-1}\left(\frac{iq(T1)}{id(T1)}\right)\right) = \frac{\theta 2 - \theta 1}{\tau 12} \quad \text{formula (4)}$$

In the formula (4), the τ12 is the time interval between the time point T1 and the time point T2.

Continue, in step S340, at this moment, the phase sequence between the power conversion circuit 140 and main power supply AC is determined as positive or negative by the control unit 162. Specifically, two consecutive sets of current phase angles θ1 and θ2 calculated by the control unit 162 of the control circuit 160 can be used to determine whether the phase sequence at this moment is positive or negative. In the three-phase alternating current circuit, the positive sequence of the phase sequence refers to that phase a is 120 degree ahead of phase b, phase b is 120 degree ahead of phase c, phase c is 120 degree ahead of phase a, the phase sequence for positive sequence can include a/b/c, b/c/a and c/a/b formations according to its combination. In other words, the negative sequence of the phase sequence refers to that phase a is 120 degree behind phase b, phase b is 120 degree behind phase c, phase c is 120 degree behind phase a, the phase sequence for negative sequence can includes c/b/a, b/a/c and a/c/b formations according to its combination. The wire connection manner in embodiments shown in FIG. 1 or FIG. 2 of the present disclosure is taken for an example, if the phase sequence of the output filter circuit 120 transmitted from the main power supply AC is positive and the phase sequence is a/b/c, the power sequence between the output filter circuit 120 and the power conversion circuit 140 with different phase sequence b/c/a, which is also positive, received by the power conversion circuit 140, required to be adjusted. Specifically, in the increasing rotation procession, determined by the control unit 162, the two successively sets of current phase angles θ1 and θ2 are rotates in direction from 0 degree to 360 degree, and when angle variation is increased or the angle calculated difference obtained by subtracting the first current phase angle θ1 from the second current phase angle θ2 is positive (that is, the second current phase θ2 is greater than the first current phase θ1, and the current phase angle is increased with time), the phase sequence at this moment is determined as positive. For example, when the second current phase angle θ2 is 100 degree and the first current phase angle θ1 is 40 degree, the current phase angle rotates in direction from 0 degree to 360 degree, and the angle variation is +60 degree obtained by subtracting the first current phase angle θ1 from the second current phase angle θ2, the phase sequence at this moment can be determined as positive. To be noted that, in another embodiment, in the increasing rotation procession that the current phase angle rotates in direction from 0 degree to 360 degree, if the aforesaid first current phase angle θ1 is 350 degree, and the second current phase angle θ2 is 40 degree, the current phase angle is actual in an increasing process, since the first current phase angle θ1 starting from 350 degree rotates through 360 degree to second current phase angle 82, 40 degree, in second circle. In this case, the rotation cross the axis of 360 degree, the difference calculating by directly subtracting the first current phase angle θ1 from the second current phase angle θ2 may be negative value. Therefore, the priority to determinate the phase sequence should still be based on rotation angle of the current phase angle, and the phase sequence being positive can be determined by the increased direction of angle.

For example, as shown in FIG. 4, in this case, there is an error in the connection sequence of the three phase wires, the sequence combination is b/c/a which is positive, the second current phase angle θ2 obtained from the second current signals Di1_2~Di3_2 at the time point T2 is greater than the first current phase angle θ1 obtained from the first current signals Di1_1~Di3_1 at the time point T1. Since the current phase angle is increased from the first current phase angle θ1 to the second current phase angle θ2 during the time point T1 to the time point T2, the control unit 162 can determine the phase sequence as positive.

On the other hand, in the decreasing rotation process of determining two consecutive current phase angles θ1 and θ2 rotate along direction from 360 degree to 0 degree, and when the angle variation of subtracting the first current phase angle θ1 from the second current phase angle θ2 is increased or the calculated phase angle difference is negative value (that is, the second current phase angle θ2 is less than the first current phase angle θ1, the current phase angle decreases with time), the control unit 162 determines that the phase sequence as negative. For example, when the second current phase angle θ2 is 120 degree and the first current phase angle θ1 is 180 degree, the current phase angle rotates along direction from the 360 degree to 0 degree, and the angle variation of subtracting the first current phase angle θ1 from the second the current phase angle θ2 is −60 degree, and the control unit 162 can determine that the phase sequence as negative at this moment. To be noted that, in the other embodiment, during the current phase angle rotates along the direction from 360 degree to 0 degree, if the aforesaid first current phase angle θ1 is 20 degree, and the second current phase angle θ2 is 320 degree, the current phase angle is still decreased, since the current phase started from the first current phase angle θ1, 20 degree, is decreased 60 degree (through the 360 degree) to the second current phase angle θ2, 320 degree. In the case of crossing the 360 degree, directly calculating the difference between the second current phase angle θ2 and the first current phase angle θ1 may obtain the positive value, so the priority sequence for determining the phase sequence at this moment should still give to the rotation direction of the current phase angle, the phase sequence is determined as negative by the decreasing rotation direction.

Figure 5:
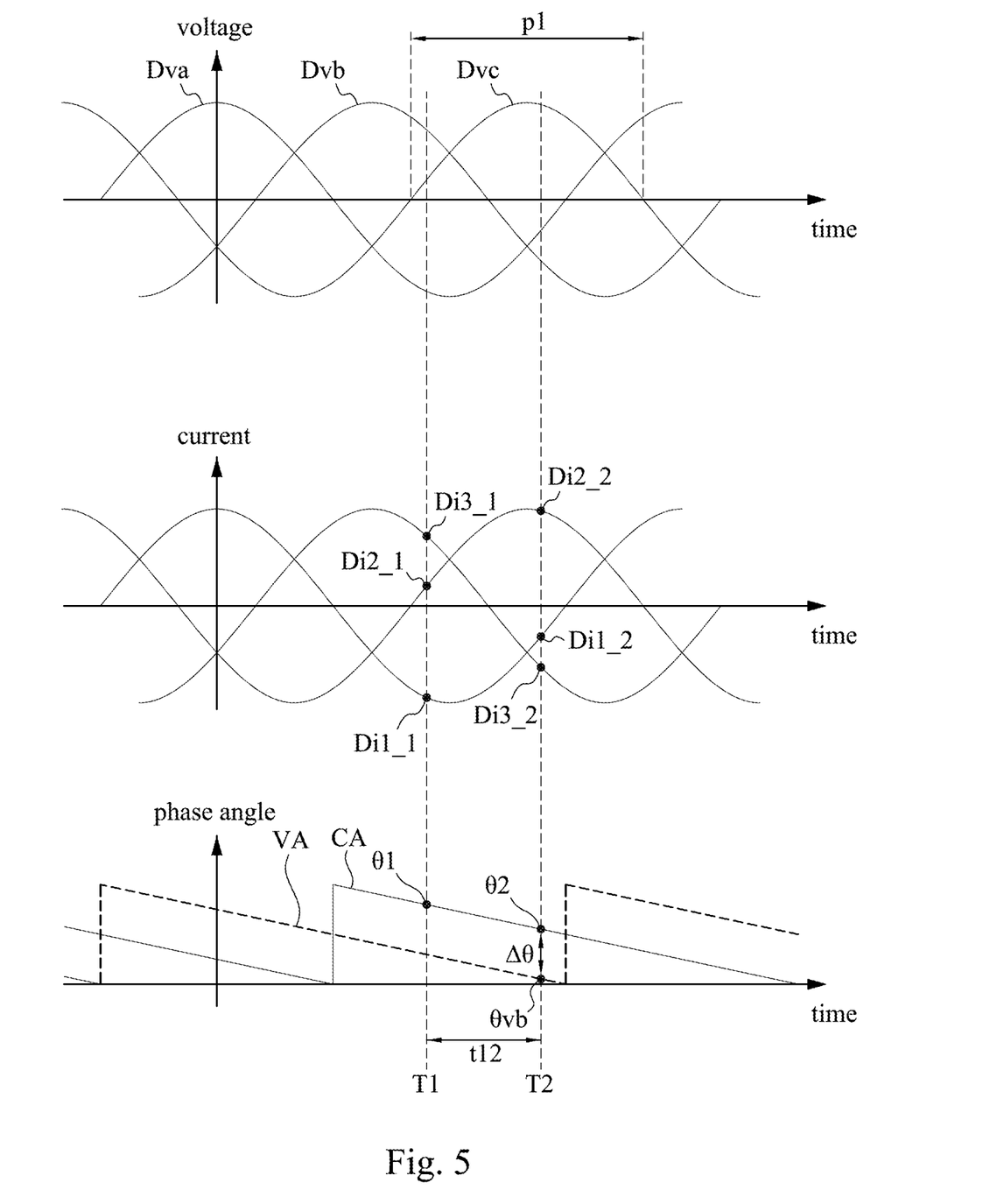
FIG. 5 is a waveform schematic diagram of voltages and currents in accordance with some embodiments of the present disclosure.

For example, as shown in FIG. 5, in this case, there is an error in connection sequence of three phase wires, the connection sequence is a/c/b which is negative order, the second current phase angle θ2 obtained from the second current signal Di1_2~Di3_2 at the time point T2 is less than the first current phase angle θ1 obtained from the first current signal Di1_1~Di3_1 at the time point T1. And, since the current phase angle is decreased during rotation process, the control unit 162 can determine the phase sequence as negative.

When the control unit 162 determines that the phase sequence at this moment as positive or negative, step S345 is performed, to calculate the voltage phase angle of the main power supply AC as the reference signal, or the step S350 is performed, to calculate the voltage phase angle of the main power supply AC as the reference signal.

Specifically, in step S345, the voltage detection circuit 163 transmits the voltage detection signals Dva~Dvc to the control unit 162, and the control unit 162 calculates the voltage phase angle θv of the main power supply grid during the short-circuit operation time corresponding to one of the first current phase angle θ1 and the second current phase angle θ2, as the embodiment shown in FIG. 4, the control unit 162 calculates the voltage phase angle θv at the time point T2 (corresponding to the second short-circuit operation time of the second current phase angle θ2) according to the voltage detection signals Dva~Dvc of the three phases. As shown in FIG. 4, when the control unit 162 determines that the phase sequence at this moment as positive, the control unit 162 directly sets the calculated voltage phase angle θv as the reference phase angle for utilizing in the following steps. In this case, as shown in FIG. 4, the control unit 162 calculates the variation curve VA of the voltage phase angle θv is gradually increased with time from the zero crossing point (which is 0 degree) according to the voltage detection signal Dva of the "a" phase, until the voltage phase angle θv of the variation curve VA reaches 360 degree (returns to zero), the variation curve VA of the voltage phase angle θv is periodically increase again. Similarly, the control unit 162 calculates the current curve CA of the current phase angle according to the current detection signal Di1 of the "a" phase, the difference of the phase difference between two curves VA and CA caused by the wrong connection of wires, the difference is maintained at constant value.

On the other hand, when the control unit 162 determines that the phase sequence at this moment is negative, the step S350 is performed, the control unit 162 calculates the voltage phase angle θv of the main power supply grid during the short-circuit operation time corresponding to one of the first current phase angle θ1 and the second current phase angle θ2, and the aforesaid voltage phase angle θv is adjusted according to the situation that the phase sequence is determined as negative. Specifically, the control unit 162 calculates the voltage phase angle θv at the time point T2 (corresponding to the second short-circuit time of the second current phase angle θ2) according to three-phase voltage detection signals Dva~Dvc, as shown in FIG. 5, the control unit 162 subtracts 360 degree from original calculated voltage phase angle θv to produce a result, and the control unit 162 multiplies the result by a minus sign to obtain an adjusted reference signal (that is, the voltage phase angle θvb as shown in FIG. 5) according to the negative sequence, for example, if the original calculated voltage phase angle at the time point T2 is 320 degree, which is calculated according to three-phase voltage detection signal Dva~Dvc, and when the phase sequence at this moment is negative, the control unit 162 subtracts 360 degree from the original calculated voltage phase angle according to the negative sequence to produce a result, and the control unit 162 multiplies the result by the minus sign to obtain the adjusted voltage phase angle θvb according to the negative sequence. That is, the adjusted voltage phase angle θvb=[−1*(320−360)]=40 degree. As shown in FIG. 5, the variation curve VA of the adjusted voltage phase angle θvb, calculated by the control unit 162 according to the voltage detection signal Dva at the "a" phase is gradually decreased with time until the voltage phase angle θvb of the variation curve VA adjusted by the negative sequence reach the zero crossing point (which is 0 degree), the variation curve VA of the adjusted voltage phase angle θvb is periodically decreased again. Similarly, the control unit 162 calculates the variation curve CA of the current phase angle according to the current detection signal Di1 at the "a" phase, the difference of the phase difference between two curves VA and CA is caused by the wrong connection of wires, the difference is maintained at constant value.

Continuously, in step S360, according to the phase sequence being positive or negative, a phase angle difference Δθ between the corresponding voltage phase angle and one of the first current phase angle θ1 and the second current phase θ2 is calculated. Specifically, the phase angle difference Δθ can be calculated according to the first current phase angle θ1 or the second current phase θ2 calculated at the time point corresponding to one of the first and second short-circuit operations and the voltage phase angle (the voltage phase angle θv) obtained at the short-circuit operation corresponding to the selected current phase angle. That is, the phase angle difference is calculated according to the selected current phase angle and the voltage phase angle during the short-circuit operation corresponding to the selected current phase angle. For example, if the phase sequence at this moment is positive, the phase angle difference Δθ equal to subtract the current phase angle θ2 at corresponding time point T2 from voltage phase angle θv at corresponding time point T2. Another example, if the phase sequence at this moment is negative and the current phase angle θ2 is selected to compare with the voltage phase angle, as shown in FIG. 5, the phase angle difference Δθ equal to subtract the voltage phase angle θvb corresponding to time point T2 is adjusted by the negative sequence from the current phase angle θ2 corresponding to time point T2.

In this way, the phase sequence can be determined as positive or negative by performing two short-circuit operations to obtain two current phase angles θ1 and θ2, and comparing the second current phase angle θ2 obtained from the second current signal Di1_2~Di3_2 with the first current phase angle θ1 obtained from the first current signal Di1_1~Di3_1. According to the phase sequence at this moment being positive or negative, one of the current phase angle θ1 and θ2 is selected and is compared with voltage phase angle θvb of the reference signal adjusted by the negative sequence or the voltage phase angle θv corresponding to the selected current phase angle, so as to obtain the stable and accurate phase angle difference Δθ between the voltage phase angle and the current phase angle.

Finally, in step S370, the control unit 162 adjusts the feedback phase sequence of the power conversion circuit 140 according to the phase angle difference Δθ. Specifically, since the combination of connecting the nodes N1, N2 and N3 to the nodes Na, Nb and Nc has six different combination types, such that the phase angle difference Δθ corresponds to one of the degree, 0, 60, 120, 180, 240 and 300 during one type of the combination. Therefore, the control unit 162 can determine what the feedback phase sequence at this moment is according to the different phase angle difference Δθ, and provide the feedback control signal CS2 as the phase angle difference Δθ to the current detection circuit 161.

Figure 6A:
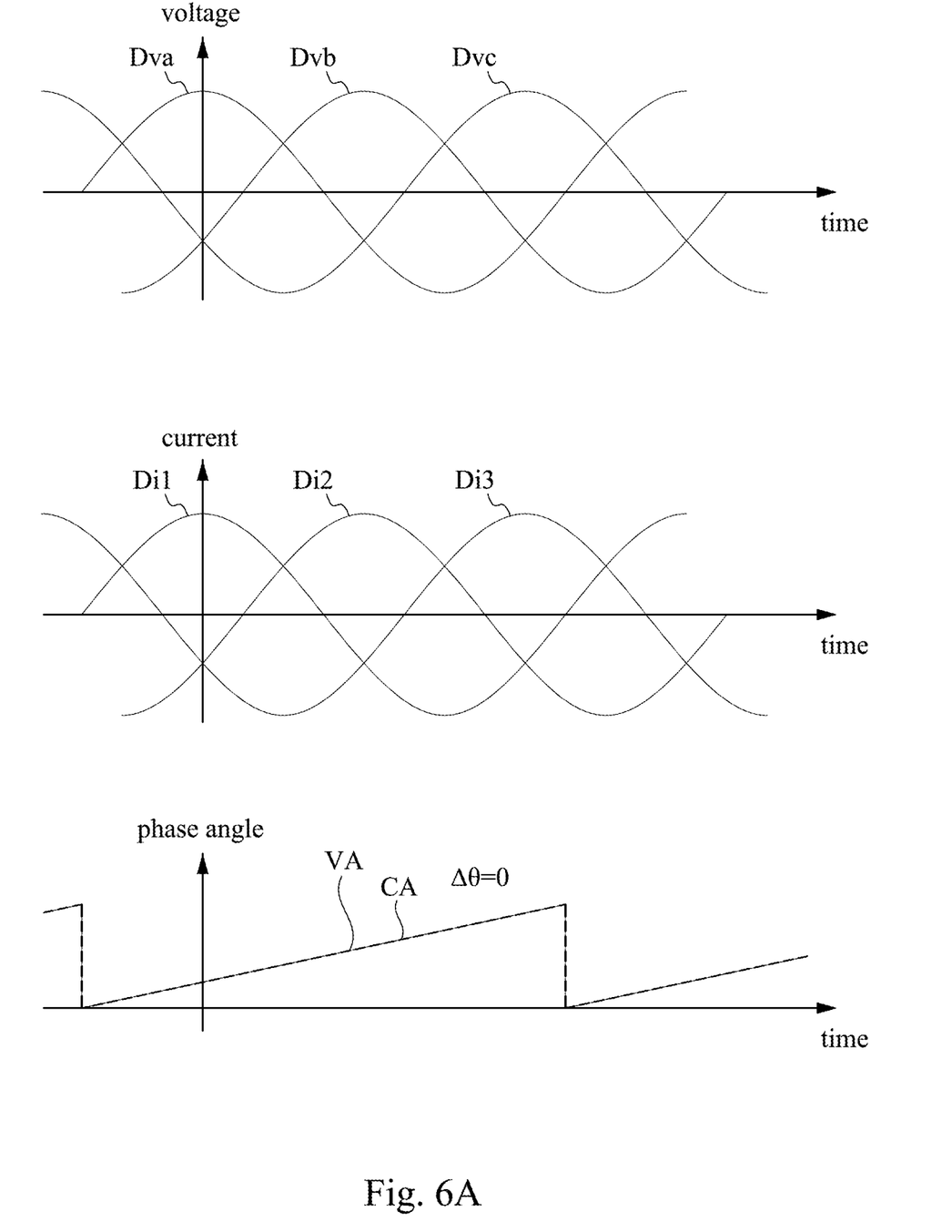
FIGS. 6A-6D are waveform schematic diagrams of voltages and currents in accordance with some embodiments of the present disclosure.
Figure 6B:
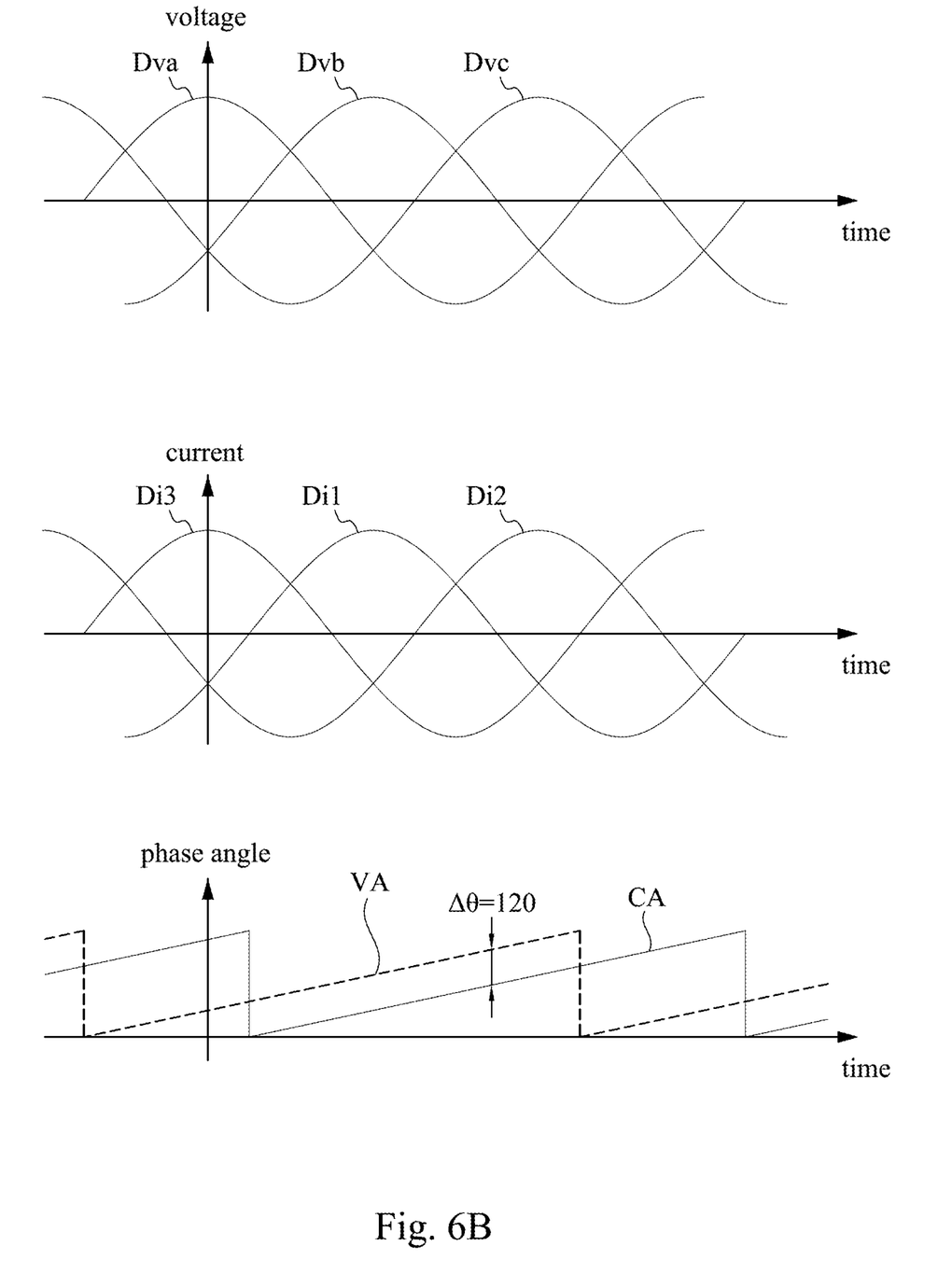
Figure 6C:
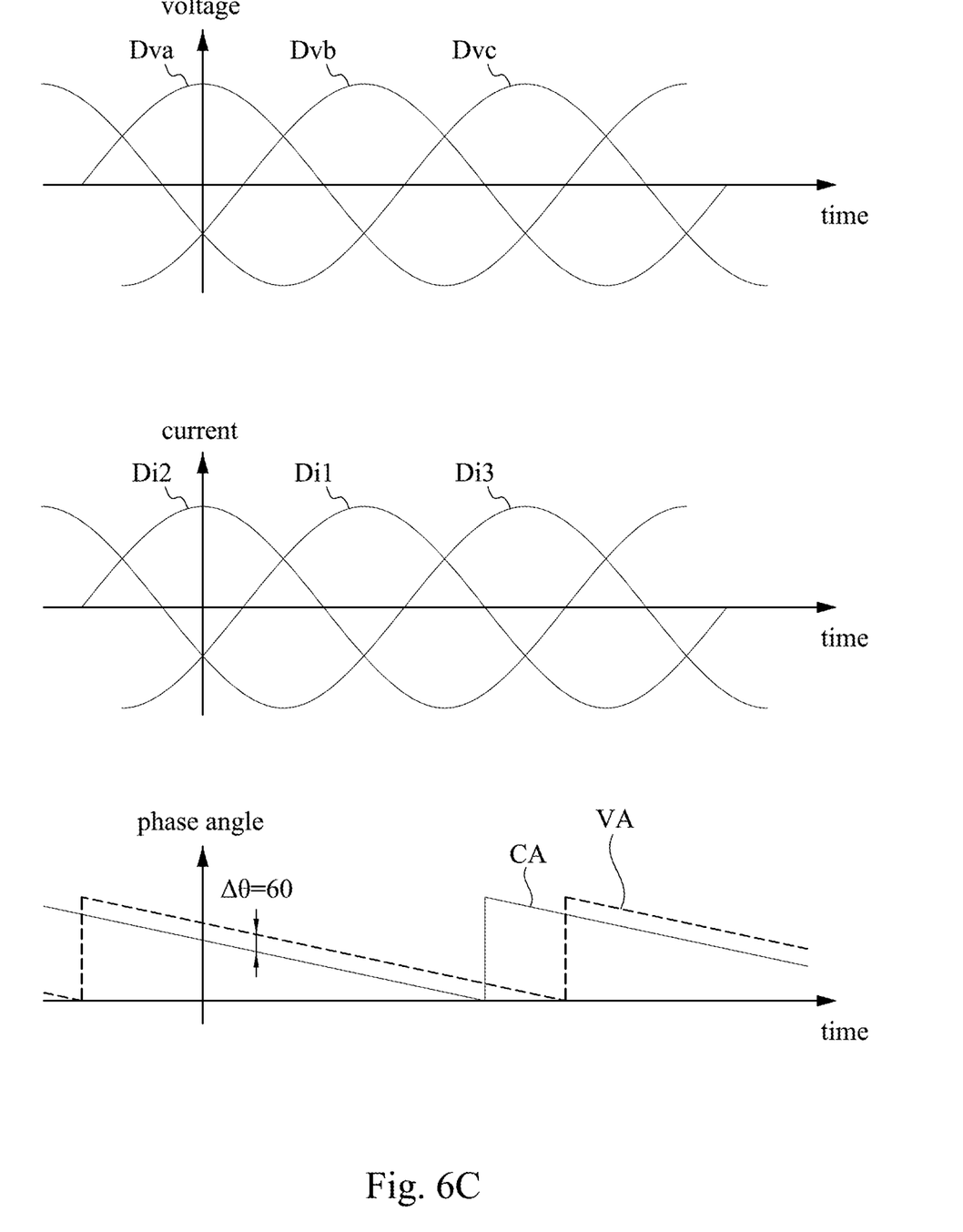
Figure 6D:
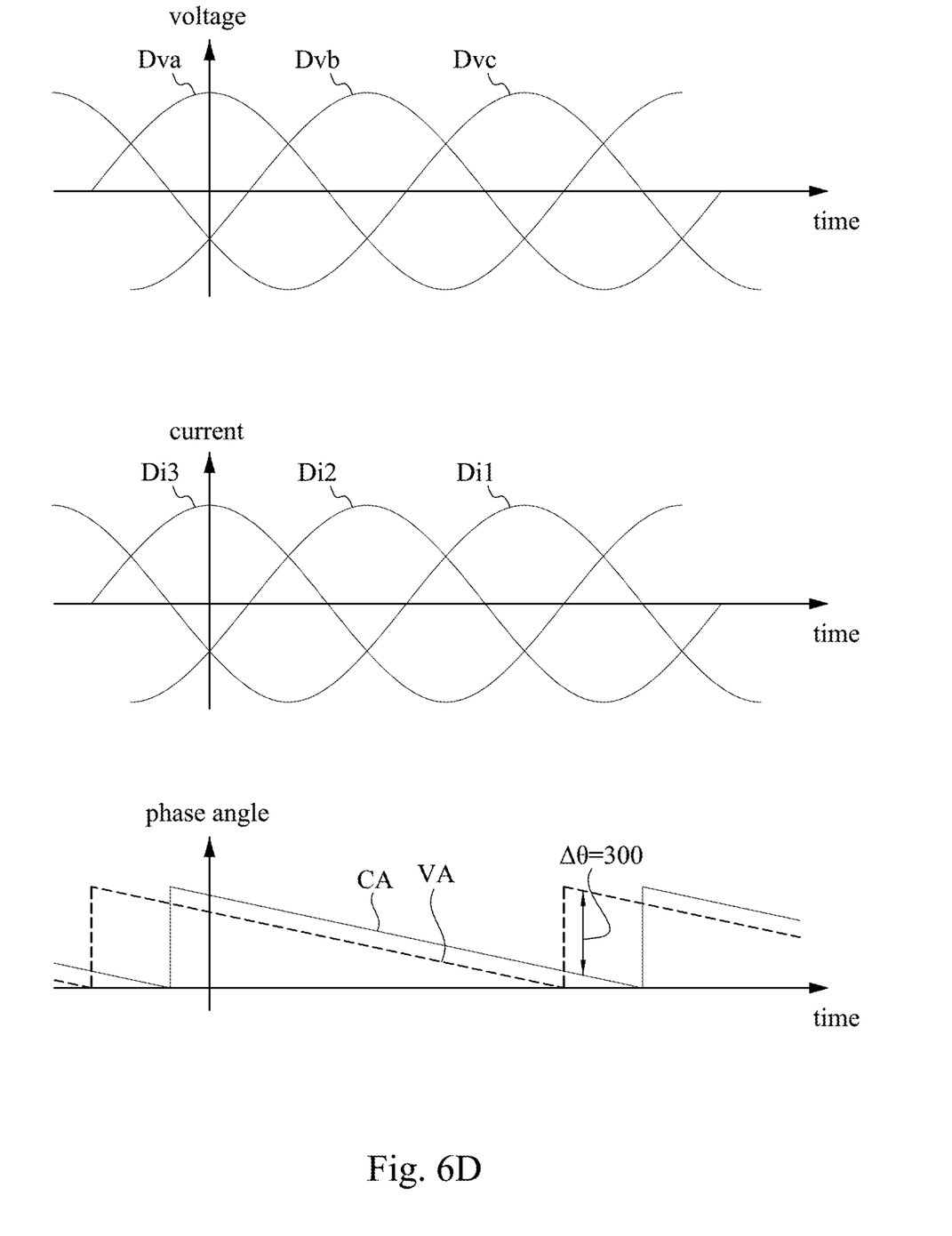

If following examples are all taken by electrically connecting the main power supply AC to the output filter circuit 120 with constant phase sequence, which is sequentially phase a, phase b, phase c (three phases AC power supply), the following examples can be distinguished based on the phase angle difference Δθ and six combination types of electrically connecting the output filter circuit 120 to the power conversion circuit 140. As shown in FIG. 4, when the phase angle difference Δθ is 240 degree, the phase sequence can be obtained as phase b, phase c, phase a at this moment, and as the embodiment shown in FIG. 4, the voltage phase angle between the variation curve VA of the voltage phase angle θv and the variation curve CA of the current phase angle is constant, that is, no matter what the current phase angle is selected, the phase angle difference Δθ is constant. Specifically, the phase angle difference Δθ calculated by the first current phase angle θ1 and the corresponding voltage phase angle θv equal to the phase angle difference Δθ calculated by the second current phase angle θ2 and the corresponding voltage phase angle θv, as the embodiment shown in FIG. 4, the phase angle difference Δθ is always 240 degree. As the embodiment shown in FIG. 5, which is similarly to the aforementioned embodiment. In this embodiment, the phase angle difference Δθ is constant at 180 degree, such that the phase sequence at this moment can be obtained as negative and the combination sequence is phase a, phase c, phase b. As the embodiment shown in FIG. 6A, the phase angle difference Δθ is constant at 0 degree, such that the phase sequence at this moment can be obtained as positive and the combination sequence is accurately phase a, phase b, phase c. As the embodiment shown in FIG. 6B, the phase angle difference Δθ is constant at 120 degree, such that the phase sequence at this moment can be obtained as positive and the combination sequence is phase c, phase a, phase b. As the embodiment shown in FIG. 6C, the phase angle difference Δθ is constant at 60 degree, such that the phase sequence at this moment can be obtained as negative and the combination sequence is phase b, phase a, phase c. As the embodiment shown in FIG. 6D, the phase angle difference Δθ is constant at 300 degree, such that the phase sequence at this moment can be obtained as negative and the combination sequence is phase c, phase b, phase a. To be noted that, when the phase angle difference Δθ is 0 degree, the positive sequence and the combination sequence of the phase sequence at this moment is same with the input of the main power supply AC, so the feedback phase sequence is no need to be adjusted.

By determining the feedback phase (phase sequence) at this moment according to the phase angle difference Δθ, the control unit 162 can generate the corresponding relation between the current detection signals Di1~Di3 which are inner defined and the feedback control signal CS2 generated by the control unit 162, so as to adjust the phase sequence to be consistent with the feedback phase sequence of the input voltage of the main power supply AC at this moment, such that the phase sequence can be redefined according to the feedback control CS2 without modify the connection sequence of physical wires, in order to ensure the power conversion circuit 140 operates normally.

For example, as the embodiment shown in FIG. 4, the control unit 162 obtain the phase sequence as positive at this moment and the phase combination is phase b, phase c, phase a (which is the wire connection sequence in area A1 shown in FIG. 2), according to the phase angle difference Δθ, 240 degree. Therefore, the control unit 162 generates the feedback control signal CS2 according to the current detection signal Di3 and the corresponding voltage detection signal Dva, and the control unit 162 outputs the feedback control signal CS2 based on the current detection signal Di3 and the corresponding voltage detection signal Dva to the corresponding switches SW3 and SW6. The control unit 162 generates the feedback control signal CS2 according to the current detection signal Di1 and the corresponding voltage detection signal Dvb, and the control unit 162 outputs the feedback control signal CS2 based on the current detection signal Di1 and the corresponding voltage detection signal Dvb to the corresponding switches SW1 and SW4. The control unit 162 generates the feedback control signal CS2 according to the current detection signal Di2 and the corresponding voltage detection signal Dvc, and the control unit 162 outputs the feedback control signal CS2 based on the current detection signal Di2 and the corresponding voltage detection signal Dvc to the corresponding switches SW2 and SW5. As a result, the power conversion circuit 140 can transfer switches SW1~SW6 according to the main power supply AC with accurate and corresponding phase sequence without modify the connection sequence of physical wires.

In summary, in aforementioned embodiments of the disclosure, two short-circuit operations are performed by successively applying the first excitation signal ES1, the second excitation signal ES2 to the power conversion circuit 140 during the time interval, so as to obtain two sets of voltage detection signals Dva~Dvc and current detection signals Di1_1~Di3_1, Di1_2~Di3_2 corresponding to two short-circuit operations, such that two current phase angles θ1 and θ2 received by the power conversion circuit 140 and the voltage phase angle θv of the main power supply AC can be calculated. The phase sequence being positive or the negative at this moment can be determined according to the variation between two current phase angles θ1 and θ2; the phase angle difference θv can be calculated according to one of two current phase angles θ1 and θ2 and the voltage phase angle θv corresponding short-circuit operation time, such that the phase combination of the phase sequence at this moment can be determined, so as to adjust the phase sequence of three phases wires of the power conversion circuit 140 to be consistent with the main power supply AC, and the voltage, current feedback information can be provided accurately to accurate the operation.

Although the disclosure has been disclosed as above in the implementation mode, it is not limited to this disclosure. Anyone who is familiar with this skill can make various modifications and retouches without departing from the spirit and scope of this case. Therefore, the scope of protection in this disclosure shall be determined by the scope of the attached patent application.

What is claimed is:

1. A phase sequence adjustment system, comprising:
   a power conversion circuit, connected to a main power supply with a phase sequence; and
   a control circuit, configured to provide a first excitation signal and a second excitation signal to a plurality of switches of the power conversion circuit at different time points, respectively, to perform two short-circuit operations between the power conversion circuit and the main power supply, and the control circuit comprises:
   a current detection circuit, configured to detect a first current signal corresponding to the first excitation signal and a second current signal corresponding to the second excitation signal, during the two short-circuit operations between the power conversion circuit and the main power supply; and
   a control unit, configured to calculate a first current phase angle and a second current phase angle, respectively, according to the first current signal and the second current signal, and the control unit is configured to select a current phase angle from the first current phase angle and the second current phase angle and correspondingly calculate a voltage phase angle of the main power supply; wherein,
   the control unit determines whether the phase sequence is positive or negative according to the first current phase angle and the second current phase angle, and the control unit calculates a phase angle difference between the selected current phase angle and the voltage phase angle, to adjust a feedback phase sequence of the power conversion circuit, according to the phase angle difference, to the current detection circuit.

2. The phase sequence adjustment system of claim 1, further comprising:
   an output filter circuit, with an input terminal and an output terminal, wherein the output filter circuit is electrically coupled between the main power supply and the power conversion circuit, wherein the power conversion circuit is electrically coupled to the output terminal of the output filter circuit with the phase sequence.

3. The phase sequence adjustment system of claim 2, wherein the control circuit further comprises a voltage detection circuit, the voltage detection circuit is coupled between the input terminal of the output filter circuit and the main power supply to detect a voltage detection signal, the control unit calculates the voltage phase angle of the main power supply according to voltage values of a plurality of phases of the voltage detection signal obtained during corresponding operation of the two short-circuit operations corresponding to the selected current phase angle.

4. The phase sequence adjustment system of claim 1, wherein,
   when the control unit determines that the phase sequence as positive, the phase angle difference is calculated by subtracting the voltage phase angle from the selected current phase angle; and
   when the control unit determines that the phase sequence as negative, the phase angle difference is calculated by subtracting the selected current phase angle from the voltage phase angle.

5. The phase sequence adjustment system of claim 4, wherein,
   when the phase sequence is determined as negative, a value is calculated by subtracting 360 degree from the voltage phase angle and the value is multiplied by a minus sign to adjust the voltage phase angle, and the phase angle difference is calculated by subtracting one of the first current phase angle and the second current phase angle from the adjusted voltage phase angle.

6. The phase sequence adjustment system of claim 4, wherein,
   if the main power supply is three-phase AC power supply with phase a/b/c, and when the phase angle difference is 60, 120, 180, 240 or 300 degree, phase combination of the phase sequence is b/a/c, c/a/b, a/c/b, b/c/a or c/b/a, respectively, the feedback phase sequence is adjusted according to the phase combination of the phase sequence; and
   if the main power supply is three-phase AC power supply with phase a/b/c, and when the phase angle difference is 0 degree, the phase sequence is positive and the phase sequence is consistent with phase of the main power supply, the feedback phase sequence is not adjusted.

7. The phase sequence adjustment system of claim 1, wherein the first excitation signal is able to applied to the power conversion circuit, at any time, to short the power conversion circuit with the main power supply, and a time interval for applying the second excitation signal to short the power conversion circuit with the main power supply again is shorter than half period of output signal of the main power supply.

8. A phase sequence adjustment method, comprising:
   applying a first excitation signal to a power conversion circuit to short the power conversion circuit with a main power supply, and obtaining a first current signal corresponding to the first excitation signal, wherein the power conversion circuit is electrically coupled to the main power supply with a phase sequence;
   applying a second excitation signal to the power conversion circuit to short the power conversion circuit with the main power supply again after a time interval, and obtaining a second current signal corresponding to the second excitation signal;

calculating a first current phase angle and a second current phase angle according to the first current signal and the second current signal, respectively;

determining whether the phase sequence is positive or negative according to the first current phase angle and the second current phase angle;

calculating a voltage phase angle of the main power supply corresponding to one of the first current phase angle and the second current phase angle obtained during the two short-circuit operations according to the phase sequence being positive or negative;

calculating a phase angle difference between the voltage phase angle and the corresponding one of the first current phase angle and the second current phase angle; and adjusting a feedback phase sequence of the power conversion circuit according to the phase angle difference.

9. The phase sequence adjustment method of claim 8, wherein applying the first excitation signal to the power conversion circuit is able to be operated at any time, to short the power conversion circuit with the main power supply, and the time interval for applying the second excitation signal to short the power conversion circuit with the main power supply again is shorter than half period of output signal of the main power supply.

10. The phase sequence adjustment method of claim 8, wherein determining whether the phase sequence is positive or negative comprises:

when in process of determining the first current phase angle rotates to the second current phase angle in direction from 0 degree to 360 degree, and phase angle variation of subtracting the first current phase angle to the second current phase angle is increased, the phase sequence is determined as positive; and when in process of determining the first current phase angle rotates to the second current phase angle in direction from 360 degree to 0 degree, and phase angle variation of subtracting the first current phase angle to the second current phase angle is decreased, the phase sequence is determined as negative.

11. The phase sequence adjustment method of claim 10, wherein, when determines that the phase sequence as positive, the phase angle difference is calculated by subtracting the voltage phase angle from a selected current phase angle selected from the first current phase angle and the second current phase angle; and when determines that the phase sequence as negative, the phase angle difference is calculated by subtracting the selected current phase angle from the voltage phase angle.

12. The phase sequence adjustment method of claim 10, further comprising:

when the phase sequence is determined as positive, the phase angle difference is calculated by subtracting the voltage phase angle from one of the first current phase angle and the second current phase angle.

13. The phase sequence adjustment method of claim 10, further comprising:

when the phase sequence is determined as negative, a value is calculated by subtracting 360 degree from the voltage phase angle and the value is multiplied by a minus sign to adjust the voltage phase angle, and the phase angle difference is calculated by subtracting one of the first current phase angle and the second current phase angle from the adjusted voltage phase angle.

14. The phase sequence adjustment method of claim 8, wherein adjusting the feedback phase sequence of the power conversion circuit according to the phase angle difference comprises:

if the main power supply is three-phase AC power supply with phase a/b/c, and when the phase angle difference is 60, 120, 180, 240 or 300 degree, phase combination of the phase sequence is b/a/c, c/a/b, a/c/b, b/c/a or c/b/a, respectively, the feedback phase sequence is adjusted according to the phase combination of the phase sequence; and if the main power supply is three-phase AC power supply with phase a/b/c, and when the phase angle difference is 0 degree, the phase sequence is positive and the phase sequence is consistent with phase of the main power supply, the feedback phase sequence is not adjusted.

15. The phase sequence adjustment method of claim 8, wherein calculating a voltage phase angle of the main power supply comprises:

calculating the voltage phase angle of the main power supply according to voltage values of a plurality of phases of the voltage detection signal obtained during corresponding operation of the two short-circuit operations corresponding to a selected current phase angle selected from the first current phase angle and the second current phase angle.

* * * * *